United States Patent
Kim et al.

(10) Patent No.: US 12,132,007 B2
(45) Date of Patent: Oct. 29, 2024

(54) SEMICONDUCTOR PACKAGE

(71) Applicant: SAMSUNG ELECTRONICS CO., LTD., Suwon-si (KR)

(72) Inventors: Jongwan Kim, Cheonan-si (KR); Kyong Hwan Koh, Suwon-si (KR); Juhyeon Oh, Asan-si (KR); Yongkwan Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/103,584

(22) Filed: Jan. 31, 2023

(65) Prior Publication Data

US 2023/0170310 A1  Jun. 1, 2023

Related U.S. Application Data

(63) Continuation of application No. 17/212,035, filed on Mar. 25, 2021, now Pat. No. 11,581,266.

(30) Foreign Application Priority Data

Aug. 25, 2020  (KR) .................. 10-2020-0107356

(51) Int. Cl.
*H01L 23/552* (2006.01)
*H01L 21/56* (2006.01)
*H01L 23/498* (2006.01)
*H01L 23/00* (2006.01)

(52) U.S. Cl.
CPC .......... *H01L 23/552* (2013.01); *H01L 21/568* (2013.01); *H01L 23/49816* (2013.01); *H01L 23/49838* (2013.01); *H01L 24/16* (2013.01); *H01L 2224/16227* (2013.01)

(58) Field of Classification Search
None
See application file for complete search history.

(56) References Cited

U.S. PATENT DOCUMENTS

| | | | |
|---|---|---|---|
| 7,381,906 | B2 | 6/2008 | Holmberg |
| 7,518,067 | B2 | 4/2009 | Gupta et al. |
| 8,581,419 | B2 | 11/2013 | Su et al. |
| 8,729,679 | B1 | 5/2014 | Phua |
| 10,177,096 | B2* | 1/2019 | Min ............... H01L 23/295 |
| 10,410,974 | B2* | 9/2019 | Min ............... H01L 23/295 |
| 2011/0298111 | A1* | 12/2011 | Kim ............... H01L 21/561 |
| | | | 257/E23.114 |

(Continued)

FOREIGN PATENT DOCUMENTS

EP  0914032 A1  5/1999

*Primary Examiner* — Long Pham
(74) *Attorney, Agent, or Firm* — Muir Patent Law, PLLC

(57) ABSTRACT

A semiconductor package including a substrate including at least one ground pad and a ground pattern; a semiconductor chip on the substrate; and a shield layer on the substrate and covering the semiconductor chip, wherein the shield layer extends onto a bottom surface of the substrate and includes an opening region on the bottom surface of the substrate, a bottom surface of the at least one ground pad is at the bottom surface of the substrate, a side surface of the ground pattern is at a side surface of the substrate, and the shield layer on the bottom surface of the substrate is in contact with the bottom surface of the at least one ground pad and in contact with the side surface of the ground pattern.

18 Claims, 9 Drawing Sheets

(56) References Cited

U.S. PATENT DOCUMENTS

| | | |
|---|---|---|
| 2014/0262475 A1 | 9/2014 | Liu et al. |
| 2018/0077802 A1 | 3/2018 | Kidoguchi |
| 2020/0194380 A1* | 6/2020 | Kang .................... H01L 23/295 |

* cited by examiner

SEMICONDUCTOR PACKAGE

CROSS-REFERENCE TO RELATED APPLICATIONS

This is a continuation application based on pending application Ser. No. 17/212,035, filed Mar. 25, 2021, the entire contents of which is hereby incorporated by reference.

Korean Patent Application No. 10-2020-0107356, filed on Aug. 25, 2020, in the Korean Intellectual Property Office, and entitled: "Semiconductor Package," is incorporated by reference herein in its entirety.

BACKGROUND

1. Field

Embodiments relate to a semiconductor package.

2. Description of the Related Art

A semiconductor package may be configured to allow a semiconductor chip to be easily used as a part of an electronic product. A semiconductor package may include a printed circuit board (PCB) and a semiconductor chip, which is mounted on the PCB and is electrically connected to the PCB by bonding wires or bumps.

SUMMARY

The embodiments may be realized by providing a semiconductor package including a substrate including at least one ground pad and a ground pattern; a semiconductor chip on the substrate; and a shield layer on the substrate and covering the semiconductor chip, wherein the shield layer extends onto a bottom surface of the substrate and includes an opening region on the bottom surface of the substrate, a bottom surface of the at least one ground pad is at the bottom surface of the substrate, a side surface of the ground pattern is at a side surface of the substrate, and the shield layer on the bottom surface of the substrate is in contact with the bottom surface of the at least one ground pad and in contact with the side surface of the ground pattern.

The embodiments may be realized by providing a semiconductor package including a substrate including a chip region; a semiconductor chip on the chip region of the substrate; a mold layer on the substrate and covering the semiconductor chip; a shield layer on the mold layer and covering a top surface and a side surface of the mold layer and a side surface of the substrate, the shield layer extending onto a bottom surface of the substrate and including an opening region on the bottom surface of the substrate; and a ground terminal on the bottom surface of the substrate and electrically connected to the shield layer, wherein the ground terminal is on the chip region.

The embodiments may be realized by providing a semiconductor package including a substrate including at least one ground pad, a ground pattern, and a ground terminal pad; a semiconductor chip on the substrate; a mold layer on the substrate and covering the semiconductor chip; a shield layer on the mold layer and covering a top surface and a side surface of the mold layer and a side surface of the substrate, the shield layer extending onto a bottom surface of the substrate and including a plurality of opening regions on the bottom surface of the substrate; a plurality of test pads at the bottom surface of the substrate; an outer terminal on the bottom surface of the substrate; and a ground terminal on the bottom surface of the substrate, wherein a bottom surface of the at least one ground pad is at the bottom surface of the substrate, a side surface of the ground pattern is at the side surface of the substrate, the shield layer on the bottom surface of the substrate is in contact with the bottom surface of the at least one ground pad and the side surface of the ground pattern, and the test pad, the ground terminal, and the outer terminal are aligned with the plurality of opening regions of the shield layer such that the plurality of opening regions of the shield layer expose the test pad, the ground terminal, and the outer terminal.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
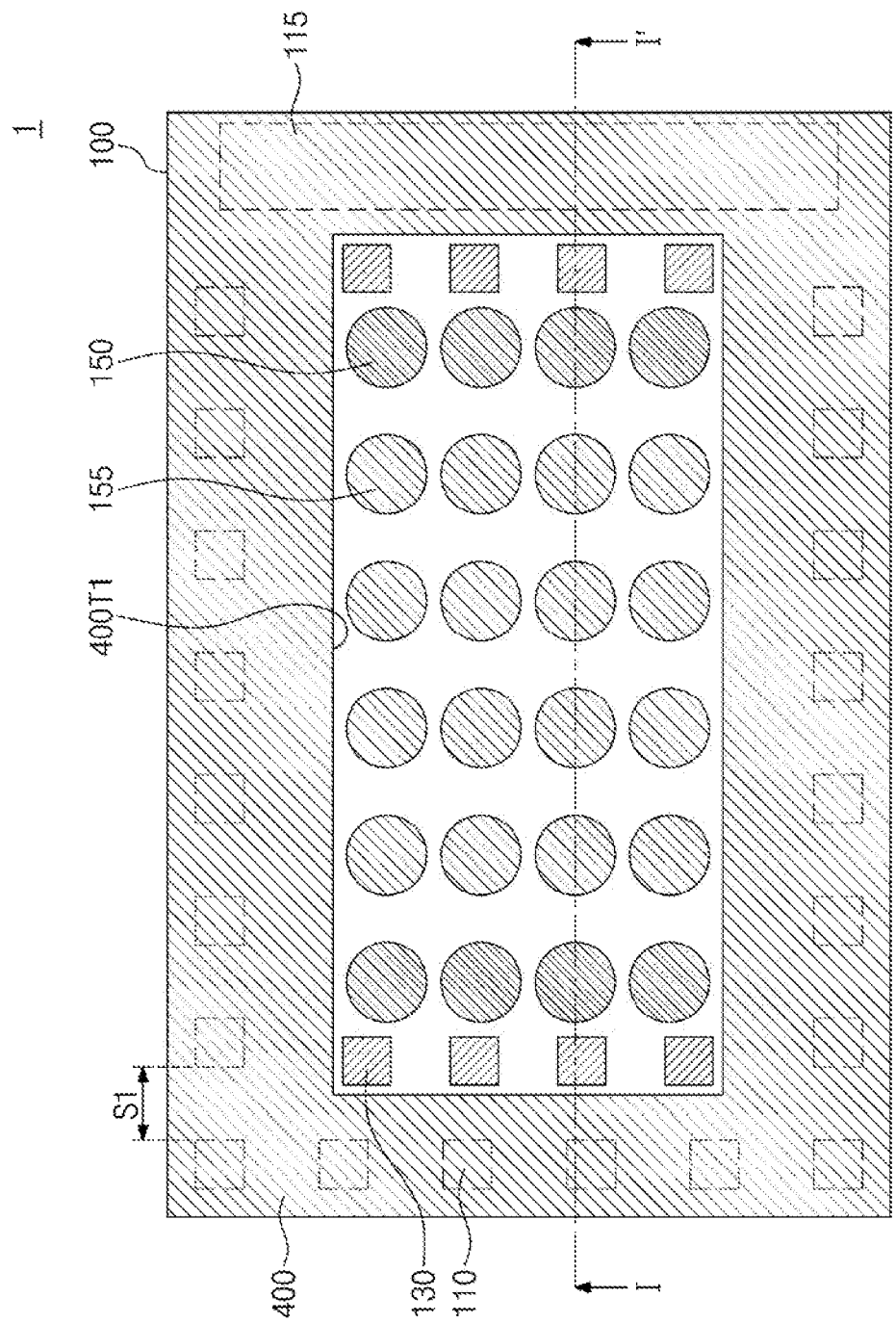
FIG. 1 is a plan view of a semiconductor package according to an embodiment.
Figure 2:
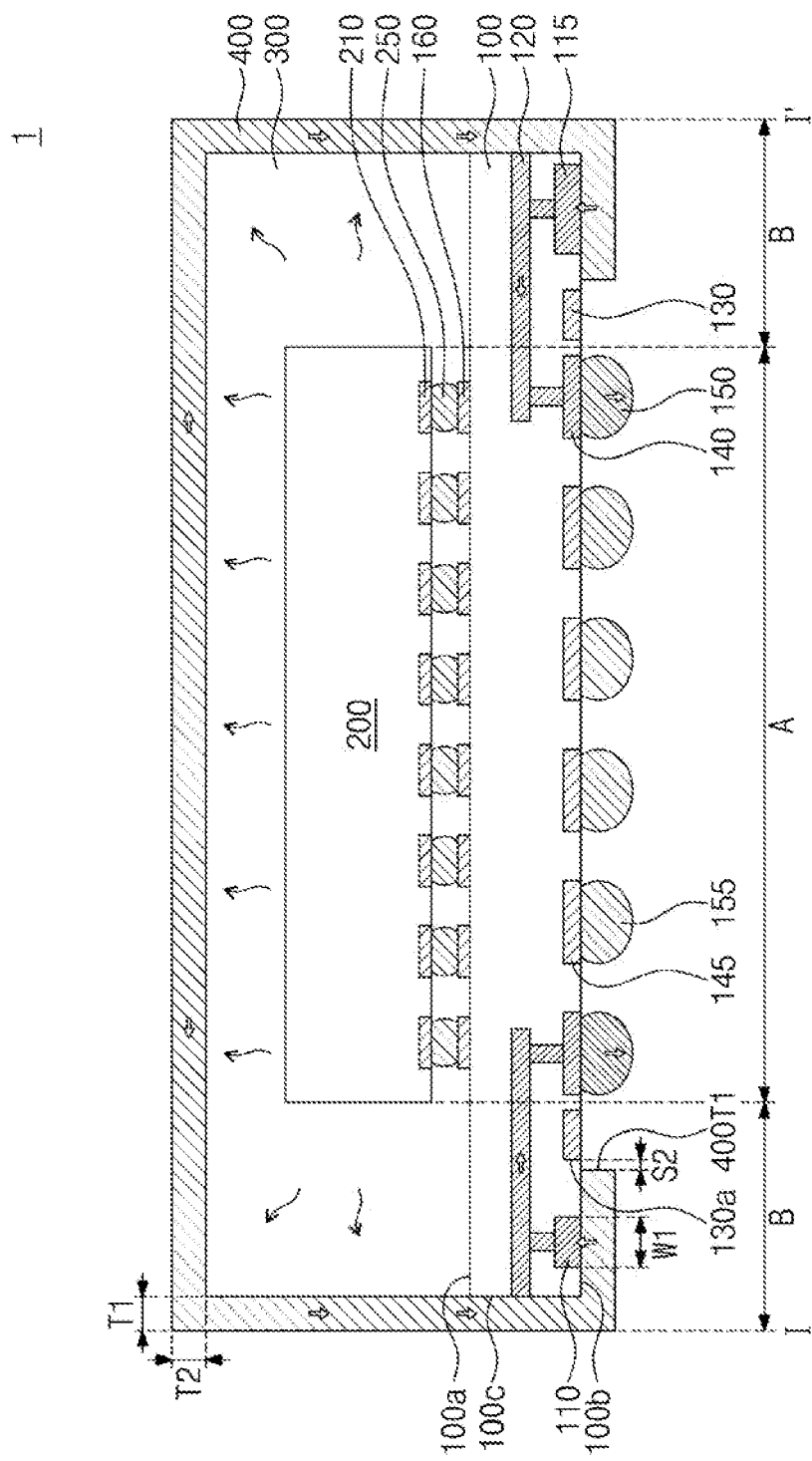
FIG. 2 is a sectional view taken along a line I-I' of FIG. 1.

FIG. 1 is a plan view of a semiconductor package according to an embodiment. FIG. 2 is a sectional view taken along a line I-I' of FIG. 1.

Referring to FIGS. 1 and 2, a semiconductor package 1 may include a substrate 100, a semiconductor chip 200, a mold layer 300, and a shield layer 400. The substrate 100 may be a printed circuit board (PCB). In an implementation, the substrate 100 may be a semiconductor substrate, a redistribution substrate, or a flexible substrate. The substrate 100 may include a chip region A, on which the semiconductor chip 200 is mounted, and an edge region B, on which the semiconductor chip 200 is not mounted (e.g., around the chip region A). The substrate 100 may include a first ground pad 110, a second ground pad 115, a ground pattern 120, a test pad 130, a ground terminal pad 140, a terminal pad 145, and a substrate pad 160.

The first and second ground pads 110 and 115 may be in the substrate 100. The first and second ground pads 110 and 115 may be near or at a bottom surface 100b of the substrate 100. A bottom surface of the first ground pad 110 and a bottom surface of the second ground pad 115 may be exposed on or at the bottom surface 100b of the substrate 100. The first and second ground pads 110 and 115 may be on the edge region B of the substrate 100. In an implementation, the first and second ground pads 110 and 115 may be on the chip region A of the substrate 100. A width W1 of the first ground pad 110 may be in a range of 280 μm to 600 μm. In the present specification, the width may mean a length measured in a direction parallel to a top surface 100a of the substrate 100 (e.g., a horizontal direction). When viewed in a plan view, an area of the second ground pad 115 may be larger than an area of the first ground pad 110.

In an implementation, a plurality of the first ground pads 110 may be provided. The first ground pads 110 may be spaced apart from each other in a direction parallel to the top surface 100a of the substrate 100. A horizontal distance S1 between the first ground pads 110 may be in a range of 100 μm to 1.03 mm. In the present specification, the horizontal distance S1 may be the smallest distance between opposite or facing surfaces of two adjacent ones of the first ground pads 110 measured in a direction parallel to the top surface 100a of the substrate 100. Shielding ability of the semiconductor package 1 could be deteriorated as resistance of the first or second ground pad 110 or 115 is increased by decreasing an area thereof or the horizontal distance S1 between the first ground pads 110 is increased. In an implementation, the horizontal distance S1 between the first ground pads 110 may be in a range of 100 μm to 1.03 mm as described above, and in this case, it is possible to help prevent the shielding ability of the semiconductor package 1 from being deteriorated.

In an implementation, a plurality of the second ground pads 115 may be provided. The first ground pad 110 and the second ground pad 115 may include a conductive metal material and may be formed of or include a metallic material (e.g., copper (Cu), tin (Sn), lead (Pb), nickel (Ni), gold (Au), silver (Ag), aluminum (Al), or bismuth (Bi)). As used herein, the term "or" is not an exclusive term, e.g., "A or B" would include A, B, or A and B.

The ground pattern 120 may be in the substrate 100. A portion of the ground pattern 120 may be exposed on or at a side surface 100c of the substrate 100. The exposed portion of the ground pattern 120 may be a side surface of the ground pattern 120. The ground pattern 120 may be electrically connected to at least one of the first and second ground pads 110 and 115 and a ground terminal 150, which will be described below. In the present specification, the description of two elements being electrically connected/coupled to each other may mean that the elements are directly connected/coupled to each other or are indirectly connected/coupled to each other through another conductive element. In an implementation, a plurality of the ground patterns 120 may be provided. At least one of the ground patterns 120 may electrically connect the first ground pad 110 to the ground terminal 150. At least one of the ground patterns 120 may electrically connect the second ground pad 115 to the ground terminal 150. The ground pattern 120 may include a conductive metal material and may be formed of or include a metallic material (e.g., copper (Cu), aluminum (Al), tungsten (W), or titanium (Ti)).

The test pad 130 may be in the substrate 100. The test pad 130 may be adjacent to or at the bottom surface 100b of the substrate 100. A bottom surface of the test pad 130 may be exposed on or at the bottom surface 100b of the substrate 100. The test pad 130 may be used to test electric characteristics of the semiconductor chip 200. The test pad 130 may be electrically disconnected from the first and second ground pads 110 and 115. In an implementation, a plurality of the test pads 130 may be provided. The test pads 130 may be spaced apart from each other in the direction parallel to the top surface 100a of the substrate 100. Some of the test pads 130 may be between the first ground pad 110 and the ground terminal 150. Others of the test pads 130 may be between the second ground pad 115 and the ground terminal 150. The test pad 130 may be adjacent to the ground terminal pad 140. The test pad 130 may be formed of or include a conductive metal material.

The ground terminal pad 140 may be in the substrate 100. The ground terminal pad 140 may be adjacent to or at the bottom surface 100b of the substrate 100. A bottom surface of the ground terminal pad 140 may be exposed on or at the bottom surface 100b of the substrate 100. The ground terminal pad 140 may be electrically connected to the ground pattern 120. The ground terminal pad 140 may be spaced apart from the first ground pad 110, the second ground pad 115, and the test pad 130. The ground terminal pad 140 may be electrically disconnected from the test pad 130. In an implementation, the ground terminal pad 140 may be on the chip region A of the substrate 100. In an implementation, the ground terminal pad 140 may be on the edge region B of the substrate 100. In an implementation, a plurality of the ground terminal pads 140 may be provided. The ground terminal pads 140 may be spaced apart from each other in the direction parallel to the top surface 100a of the substrate 100. The ground terminal pad 140 may include a conductive metal material and may be formed of or include a metallic material (e.g., copper (Cu), tin (Sn), lead (Pb), nickel (Ni), gold (Au), silver (Ag), aluminum (Al), or bismuth (Bi)).

A ground terminal 150 may be on the bottom surface 100b of the substrate 100. In an implementation, the ground terminal 150 may be on the bottom surface of the ground terminal pad 140 to be in direct contact with the ground terminal pad 140. The ground terminal 150 may be electrically connected to each of the first and second ground pads 110 and 115 through the ground pattern 120. In an implementation, a plurality of the ground terminals 150 may be provided. The ground terminals 150 may be spaced apart from each other in the direction parallel to the top surface 100a of the substrate 100. The ground terminal 150 may include, e.g., a solder ball, a solder bump, or a solder pillar. The ground terminal 150 may include a conductive metal material and may be formed of or include a metallic material (e.g., tin (Sn), lead (Pb), nickel (Ni), gold (Au), silver (Ag), copper (Cu), aluminum (Al), or bismuth (Bi)).

The terminal pad 145 may be in the substrate 100. The terminal pad 145 may be near or at the bottom surface 100b of the substrate 100. A bottom surface of the terminal pad 145 may be exposed on or at the bottom surface 100b of the substrate 100. The terminal pad 145 may be electrically connected to at least one of metal lines in the substrate 100. The terminal pad 145 may be spaced apart from the ground terminal pad 140 in the direction parallel to the top surface 100a of the substrate 100 (e.g., the horizontal direction). The terminal pad 145 may be electrically disconnected (e.g., isolated) from the ground terminal pad 140. In an implementation, a plurality of the terminal pads 145 may be provided. The terminal pads 145 may be spaced apart from each other in the direction parallel to the top surface 100a of the substrate 100. The ground terminal pad 140 may include a conductive metal material and may be formed of or include a metallic material (e.g., copper (Cu), tin (Sn), lead (Pb), nickel (Ni), gold (Au), silver (Ag), aluminum (Al), or bismuth (Bi)).

An outer terminal 155 may be on the bottom surface 100b of the substrate 100. In an implementation, the outer terminal 155 may be on the bottom surface of the terminal pad 145 to be in direct contact with the terminal pad 145. The outer terminal 155 may be electrically connected to at least one of the metal lines in the substrate 100. The outer terminal 155 may be coupled to an external device. In an implementation, external electrical signals may be transmitted to the substrate pad 160 through the outer terminal 155. In an implementation, a plurality of the outer terminals 155 may be provided. The outer terminals 155 may be spaced apart from each other in the direction parallel to the top surface 100a of the substrate 100. The outer terminal 155 may include, e.g., a solder ball, a solder bump, or a solder pillar. The outer terminal 155 may include a conductive metal material, e.g., the outer terminal 155 may be formed of or include a metallic material (e.g., tin (Sn), lead (Pb), nickel (Ni), gold (Au), silver (Ag), copper (Cu), aluminum (Al), or bismuth (Bi)).

The terminal pad 145 and the outer terminal 155 may be used to deliver electrical signals. In an implementation, the terminal pad 145 and the outer terminal 155 may be electrically disconnected from the ground terminal pad 140 and the ground terminal 150, which are used to deliver an electromagnetic wave to the outside.

In an implementation, the ground terminal 150 and the outer terminal 155 may be on the chip region A of the substrate 100. In an implementation, the ground terminal 150 and the outer terminal 155 may be on the edge region B of the substrate 100.

The substrate pad 160 may be on the top surface 100a of the substrate 100. A top surface of the substrate pad 160 may be exposed on or at the top surface 100a of the substrate 100. The substrate pad 160 may be electrically connected to a metal line in the substrate 100. In an implementation, a plurality of the substrate pads 160 may be provided. The substrate pads 160 may be spaced apart from each other in the direction parallel to the top surface 100a of the substrate 100. The substrate pad 160 may include a conductive metal material and may be formed of or include a metallic material (e.g., copper (Cu), tin (Sn), lead (Pb), nickel (Ni), gold (Au), silver (Ag), aluminum (Al), or bismuth (Bi)).

The semiconductor chip 200 may be mounted on the substrate 100. The semiconductor chip 200 may be, e.g., a memory chip, a logic chip, a system-on-chip (SOC), or a lab-on-chip (LOC). In an implementation, the memory chip may include DRAM, SRAM, or MRAM chips. The semiconductor chip 200 may include a chip pad 210. The chip pad 210 may be near or at a bottom surface of the semiconductor chip 200. In an implementation, a plurality of the chip pads 210 may be provided. The chip pads 210 may be spaced apart from each other in a direction parallel to the top surface 100a of the substrate 100 (e.g., horizontal direction). Each of the chip pads 210 may be electrically connected to a corresponding one of the substrate pads 160. The chip pad 210 may include a conductive metal material and may be formed of or include a metallic material (e.g., copper (Cu), tin (Sn), lead (Pb), nickel (Ni), gold (Au), silver (Ag), aluminum (Al), or bismuth (Bi)).

A connection terminal 250 may be between the substrate 100 and the semiconductor chip 200. The connection terminal 250 may be on a bottom surface of the chip pad 210 and may be electrically connected to the chip pad 210. The substrate 100 and the semiconductor chip 200 may be electrically connected to each other through the connection terminal 250. In the present specification, the description of an element being electrically connected to the semiconductor chip 200 may mean that the element is electrically connected to integrated circuits in the semiconductor chip 200. Accordingly, during operations of the semiconductor chip 200, the semiconductor chip 200 may exchange electrical signals with an external device through the connection terminal 250 and the outer terminal 155.

In an implementation, a plurality of the connection terminals 250 may be provided. The connection terminals 250 may be spaced apart from each other in the direction parallel to the top surface 100a of the substrate 100. Each of the connection terminals 250 may be electrically connected to a corresponding one of the substrate pads 160. The connection terminal 250 may include, e.g., a solder ball, a solder bump, or a solder pillar. The connection terminal 250 may include a conductive metal material, e.g., the connection terminal 250 may be formed of or include a metallic material (e.g., tin (Sn), lead (Pb), nickel (Ni), gold (Au), silver (Ag), copper (Cu), aluminum (Al), or bismuth (Bi)).

The mold layer 300 may be on the substrate 100 to cover the semiconductor chip 200. The mold layer 300 may fill a region between the substrate 100 and the semiconductor chip 200. The mold layer 300 may be between the semiconductor chip 200 and the shield layer 400. The mold layer 300 may be formed of or include an insulating polymer (e.g., epoxy molding compound (EMC)).

The shield layer 400 may be on top and side surfaces of the mold layer 300 to enclose the mold layer 300. The shield layer 400 may cover the top surface of the mold layer 300, the side surface of the mold layer 300, and the side surface 100c of the substrate 100. In an implementation, the shield layer 400 may be on the substrate to cover the semiconductor chip 200. The shield layer 400 may horizontally extend (e.g., inwardly) from the side surface 100c of the substrate 100 to cover a portion of the bottom surface 100b of the substrate 100.

The shield layer 400 may have a first opening region 400T1 on or aligned with the bottom surface 100b of the substrate 100. The first opening region 400T1 may expose (e.g., the opening may overlie or be aligned with) the test pad 130, the ground terminal pad 140, and the terminal pad 145. The ground terminal 150 and the outer terminal 155 may be in the first opening region 400T1. The first opening region 400T1 may expose the ground terminal 150 and the outer terminal 155.

The shield layer 400 may cover a portion of the bottom surface 100b of the edge region B of the substrate 100. The shield layer 400 may not cover the bottom surface 100b of the chip region A of the substrate 100. The shield layer 400 may be in direct contact with the exposed bottom surface of the first ground pad 110 and the exposed bottom surface of the second ground pad 115 on the bottom surface 100b of the substrate 100. The shield layer 400 may be in direct contact with the exposed side surface of the ground pattern 120 on the side surface 100c of the substrate 100. The shield layer 400 may be electrically connected to at least one of the first ground pad 110, the second ground pad 115, or the ground pattern 120. The shield layer 400 may be electrically connected to the exposed bottom surfaces of the first and second ground pads 110 and 115 on the bottom surface 100b of the substrate 100 and the exposed side surface of the ground pattern 120 on the side surface 100c of the substrate 100. The shield layer 400 may be electrically disconnected (e.g., isolated) from the test pad 130 and the outer terminal 155.

A lateral or horizontal distance S2 between a side surface 130a of the test pad 130 and an inner side surface of the first opening region 400T1 may be in a range of 50 μm to 100 μm. The horizontal distance S2 may be the smallest distance between the side surface 130a of the test pad 130 and the inner side surface of the first opening region 400T1 measured in the direction parallel to the top surface 100a of the substrate 100.

When measured in the direction parallel to the top surface 100a of the substrate 100, a horizontal thickness T1 of the shield layer 400 (e.g., a distance between outer and inner side surfaces of the shield layer 400) may be in a range of 2.6 μm to 7.0 μm (e.g., from 3 μm to 5 μm). When measured in a direction perpendicular to the top surface 100a of the substrate 100 (e.g., a vertical direction), a vertical thickness T2 of the shield layer 400 (e.g., a distance between an outer top surface and an inner top surface of the shield layer 400, which are opposite to each other) may be in a range of 3 μm to 8 μm (e.g., from 4 μm to 6 μm).

When viewed in a plan view, the shield layer 400 on the bottom surface 100b of the substrate 100 may have a ring structure. In an implementation, the shield layer 400 on the bottom surface 100b of the substrate 100 may be a square or rectangular ring structure or a square or rectangular ring structure with rounded corners. The shield layer 400 may include a conductive metal material and may be formed of or include a metal (e.g., copper (Cu) or silver (Ag)).

The shield layer 400 may absorb an electromagnetic wave and may emit it to the outside through the first ground pad 110, the second ground pad 115, the ground pattern 120, and the ground terminal 150. In an implementation, as depicted by the arrows in FIG. 2, the shield layer 400 may absorb an electromagnetic wave and may deliver the absorbed electromagnetic wave to the exposed bottom surfaces of the first and second ground pads 110 and 115 on the bottom surface 100b of the substrate 100 and the exposed side surface of the ground pattern 120 on the side surface 100c of the substrate 100. The absorbed electromagnetic wave may be emitted to the outside through the ground terminal 150. Accordingly, it is possible to shield an electromagnetic wave, which is applied from the outside of the semiconductor package 1 or is emitted from the internal elements of the semiconductor package 1, and to help prevent an electromagnetic interference (EMI) issue from occurring. The electromagnetic interference issue could cause a failure in receiving/transmitting function of an electric element caused by an electromagnetic wave emitted from or passing through another electric element.

In an implementation, an electromagnetic wave emitted through the bottom surface 100b of the substrate 100 may be shielded by the shield layer 400, and the semiconductor package may have an improved electromagnetic wave shielding ability. In addition, the shield layer 400 may have the first opening region 400T1 exposing the test pad 130 and the terminal pad 145, and it is possible to help prevent a short circuit from occurring between the test pad 130 and the terminal pad 145. In an implementation, a terminal on the chip region A of the substrate 100 may be used as the ground terminal 150, and thus, it may be unnecessary to additionally form ground terminals on the edge region B of the substrate 100. Accordingly, it is possible to simplify the overall fabrication process of the semiconductor package.

Figure 3:
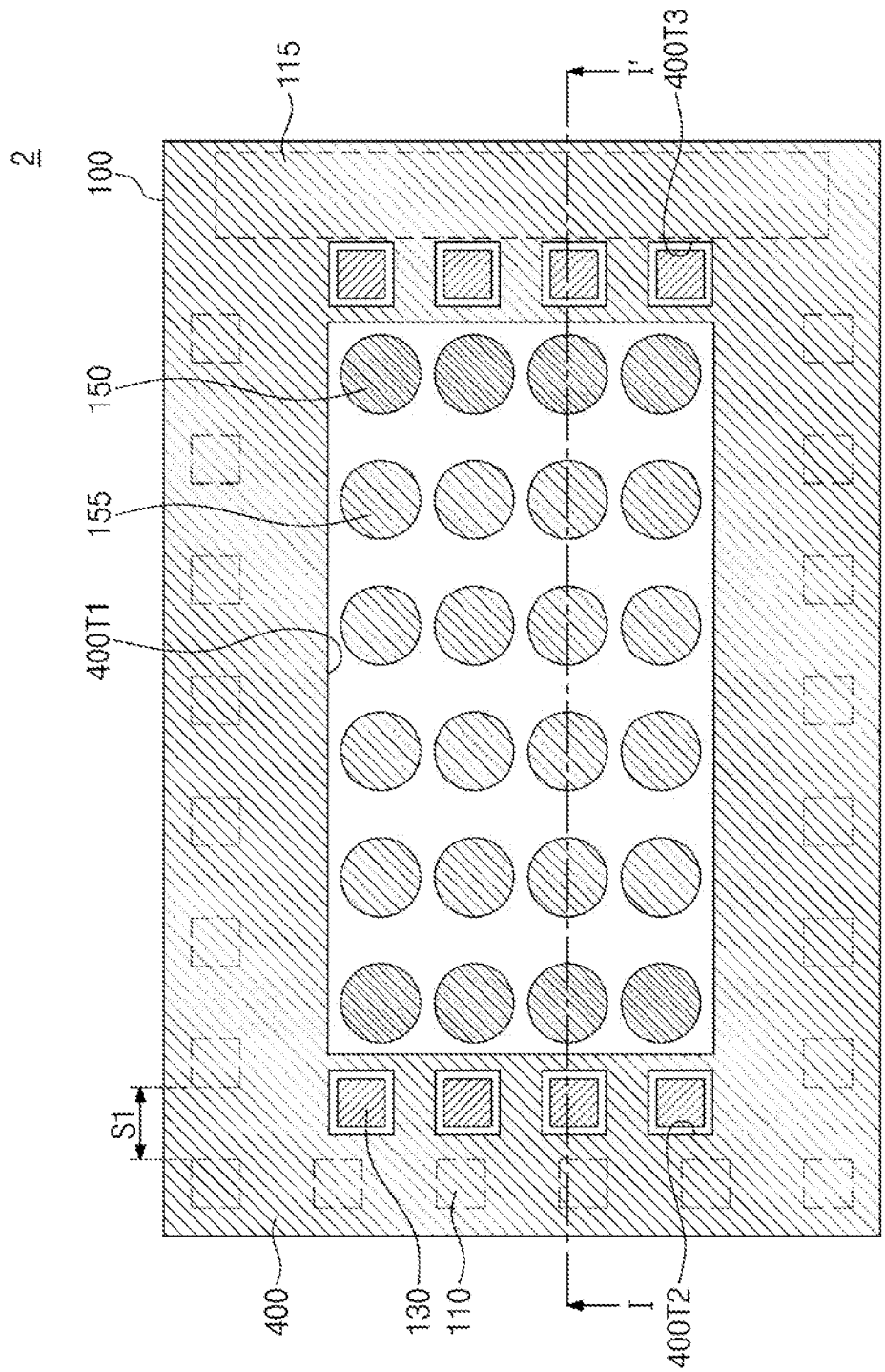
FIG. 3 is a plan view of a semiconductor package according to an embodiment.
Figure 4:
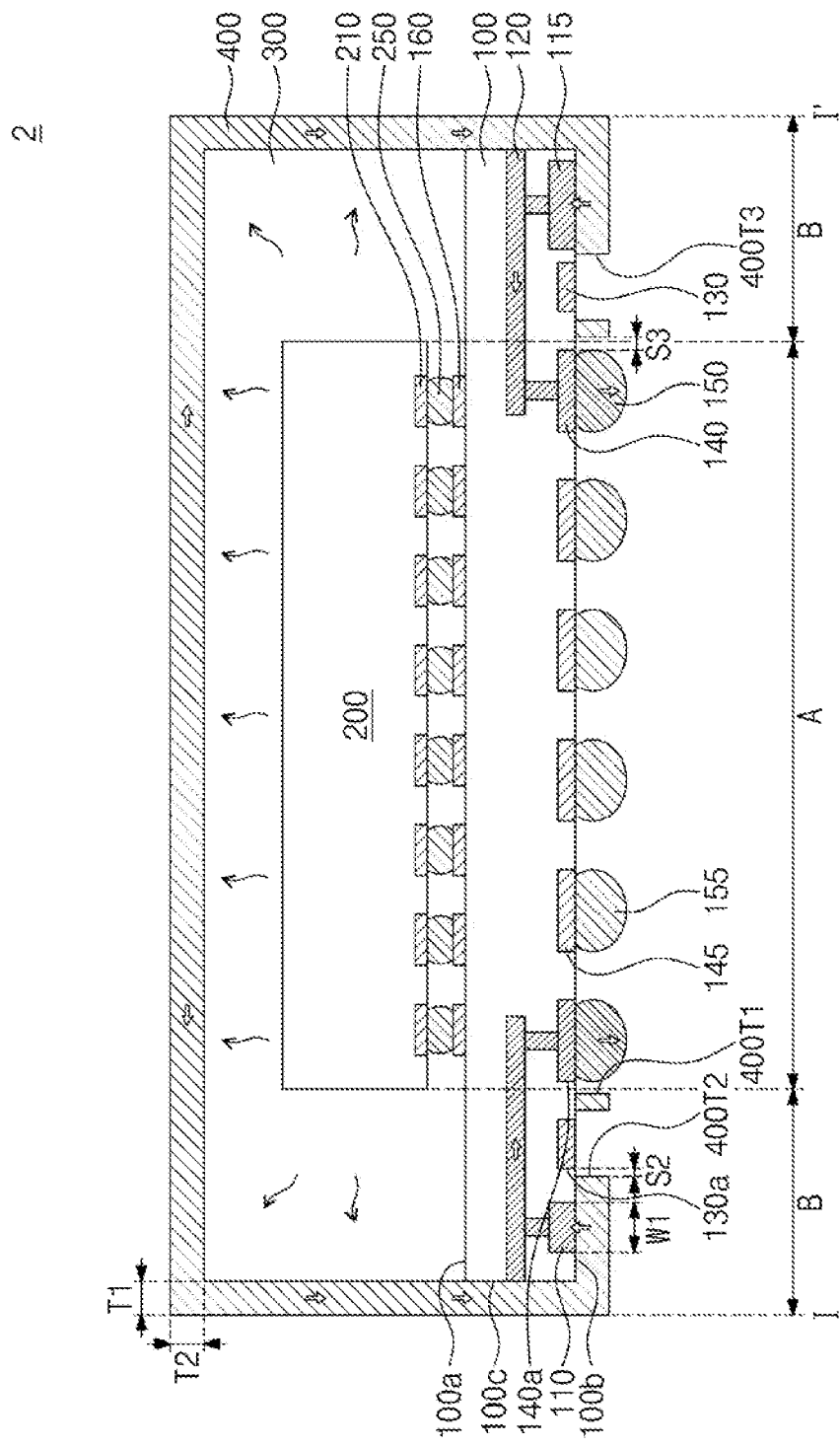
FIG. 4 is a sectional view taken along a line I-I' of FIG. 3.

FIG. 3 is a plan view of a semiconductor package according to an embodiment. FIG. 4 is a sectional view taken along a line I-I' of FIG. 3. For concise description, a previously described element may be identified by the same reference number without repeating an overlapping description thereof.

Referring to FIGS. 3 and 4, a semiconductor package 2 may include the substrate 100, the semiconductor chip 200, the mold layer 300, and the shield layer 400. The substrate 100 may include the first ground pad 110, the second ground pad 115, the ground pattern 120, the test pad 130, the ground terminal pad 140, the terminal pad 145, and the substrate pad 160. The substrate 100, the first ground pad 110, the second ground pad 115, the ground pattern 120, the test pad 130, the ground terminal pad 140, the ground terminal 150, the terminal pad 145, the outer terminal 155, the substrate pad 160, the semiconductor chip 200, and the connection terminal 250 may be configured to have substantially the same features as those described with reference to FIGS. 1 and 2.

The semiconductor package 2 according to the present embodiment may include the test pad 130, which may be adjacent or proximate to the first ground pad 110 or the second ground pad 115, unlike the semiconductor package 1 including the test pad 130, which may be adjacent or proximate to the ground terminal pad 140.

The width W1 of the first ground pad 110 may be in a range of 280 μm to 600 μm. The horizontal distance S1 between the first ground pads 110 may be in a range of 100 μm to 1.03 mm. In the case where the horizontal distance S1 between the first ground pads 110 is in a range of 100 μm to 1.03 mm, it is possible to help prevent the shielding ability of the semiconductor package 1 from being deteriorated.

The shield layer 400 may be on the top surface of the mold layer 300 and the side surface of the mold layer 300 to enclose the mold layer 300. The shield layer 400 may cover the top surface of the mold layer 300, the side surface of the mold layer 300, and the side surface 100c of the substrate 100. The shield layer 400 may extend (e.g., inwardly) along the bottom surface 100b of the substrate 100 to cover a portion of the bottom surface 100b of the substrate 100, a region between the first ground pad 110 and the test pad 130, and a region between the second ground pad 115 and the test pad 130.

The shield layer 400 may include a first opening region 400T1, a second opening region 400T2, and a third opening region 400T3, which are on or open to the bottom surface 100b of the substrate 100. The second opening region 400T2 and the third opening region 400T3 may be spaced apart from each other with the first opening region 400T1 therebetween. The second opening region 400T2 may be between the first ground pad 110 and the ground terminal pad 140. The third opening region 400T3 may be between the second ground pad 115 and the ground terminal pad 140. The first opening region 400T1 may expose the ground terminal pad 140 and the terminal pad 145. The second opening region 400T2 may expose the test pad 130 between the first ground pad 110 and the ground terminal 150. The third opening region 400T3 may expose the test pad 130 between the second ground pad 115 and the ground terminal 150. A width of the second opening region 400T2 may be larger than a width of the test pad 130. A width of the third opening region 400T3 may be larger than a width of the test pad 130. In an implementation, a plurality of the second opening regions 400T2 and a plurality of the third opening regions 400T3 may be spaced apart from each other in the direction parallel to the top surface 100a of the substrate 100.

The shield layer 400 may cover a portion of the bottom surface 100b of the edge region B of the substrate 100. The shield layer 400 may not cover the bottom surface 100b of the chip region A of the substrate 100. The shield layer 400 may be in direct contact with the exposed bottom surface of the first ground pad 110 and the exposed bottom surface of the second ground pad 115 on the bottom surface 100b of the substrate 100. The shield layer 400 may be in direct contact with the exposed side surface of the ground pattern 120 on the side surface 100c of the substrate 100. The shield layer 400 may be electrically connected to the exposed bottom surfaces of the first and second ground pads 110 and 115 on the bottom surface 100b of the substrate 100 and the exposed side surface of the ground pattern 120 on the side surface 100c of the substrate 100. The shield layer 400 may be electrically disconnected or isolated from the test pad 130 and the outer terminal 155.

A horizontal distance S2 between the side surface 130a of the test pad 130 and an inner side surface of the second opening region 400T2 may be in a range of 50 μm to 100 μm. The horizontal distance S2 may be the smallest distance between the side surface 130a of the test pad 130 and the inner side surface of the second opening region 400T2 in the direction parallel to the top surface 100a of the substrate 100. A horizontal distance S3 between a side surface 140a of the ground terminal pad 140 and the inner side surface of the first opening region 400T1 may be in a range of 50 μm to 100 μm. The horizontal distance S3 may be the smallest distance between the side surface 140a of the ground terminal pad 140 and the inner side surface of the first opening region 400T1 in the direction parallel to the top surface 100a of the substrate 100.

When measured in the direction parallel to the top surface 100a of the substrate 100, the horizontal thickness T1 of the shield layer 400 (e.g., a distance between the outer and inner side surfaces of the shield layer 400) may be in a range of 2.6 μm to 7.0 μm (e.g., from 3 μm to 5 μm). When measured in the direction perpendicular to the top surface 100a of the substrate 100, the vertical thickness T2 of the shield layer 400 (e.g., a distance between an outer top surface and an inner top surface of the shield layer 400, which are opposite to each other) may be in a range of 3 μm to 8 μm (e.g., from 4 μm to 6 μm).

When viewed in a plan view, the shield layer 400 on the bottom surface 100b of the substrate 100 may be a ring structure with a plurality of opening regions 400T2 and 400T3. In an implementation, the shield layer 400 on the bottom surface 100b of the substrate 100 may be a square or rectangular ring structure, which may include the opening regions 400T2 and 400T3. In an implementation, the shield layer 400 on the bottom surface 100b of the substrate 100 may be a square or rectangular ring structure, which may have rounded corners and include the opening regions 400T2 and 400T3.

In an implementation, an electromagnetic wave emitted through the bottom surface 100b of the substrate 100 may be shielded by the shield layer 400, and the semiconductor package may have an improved electromagnetic wave shielding ability. In addition, the shield layer 400 may include the second and third opening regions 400T2 and 400T3 exposing the test pad 130 and the first opening region 400T1 exposing the terminal pad 145, and it is possible to prevent a short circuit from occurring between the test pad 130 and the terminal pad 145. In an implementation, a terminal on the chip region A of the substrate 100 may be used as the ground terminal 150, and thus, it may be unnecessary to additionally form ground terminals on the edge region B of the substrate 100. Accordingly, it is possible to simplify the overall fabrication process of the semiconductor package.

FIGS. 5 to 9 are sectional views, which are taken along the line I-I' of FIG. 1, of stages in a method of fabricating a semiconductor package according to an embodiment. For concise description, a previously described element may be identified by the same reference number without repeating an overlapping description thereof.

Figure 5:
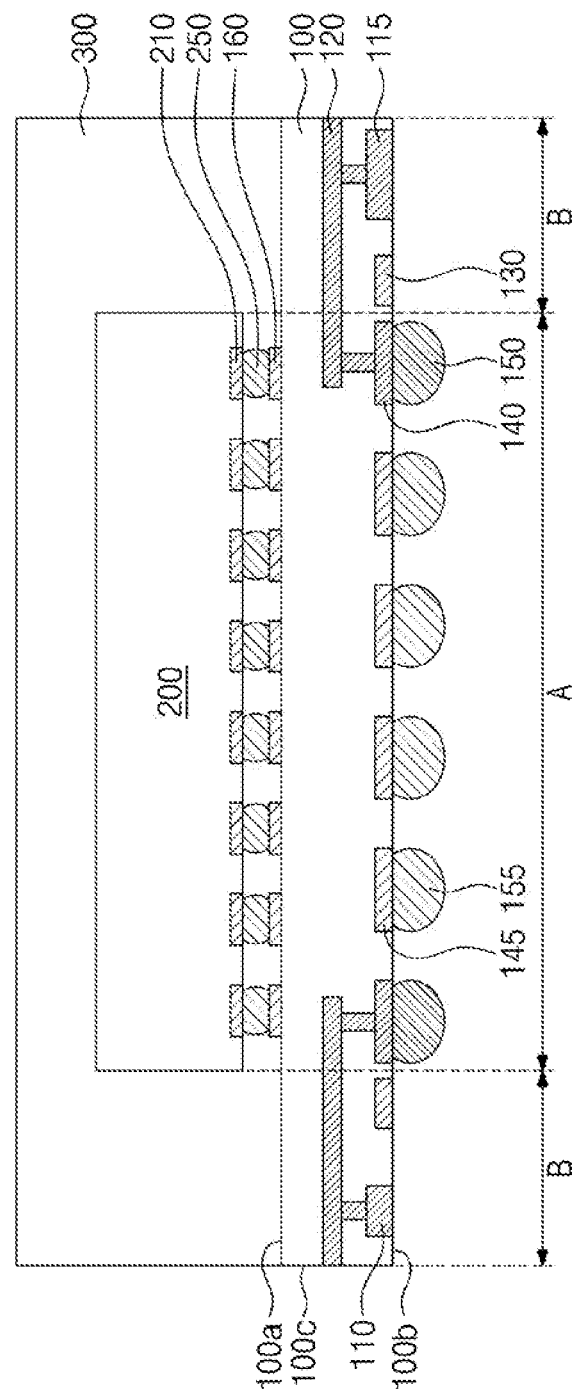
FIGS. 5 to 9 are sectional views, which are taken along the line I-I' of FIG. 1, of stages in a method of fabricating a semiconductor package according to an embodiment.

Referring to FIG. 5, the substrate 100 including the first ground pad 110, the second ground pad 115, the ground pattern 120, the test pad 130, the ground terminal pad 140, the ground terminal 150, the terminal pad 145, the outer terminal 155, and the substrate pad 160 may be provided. The semiconductor chip 200 may be mounted on the chip region A of the substrate 100. The mold layer 300 may be formed on the substrate 100 to cover the semiconductor chip 200. The mounting of the semiconductor chip 200 and the forming of the mold layer 300 may be performed in a chip level or wafer level. The ground terminals 150 and the outer terminals 155 may be formed on the bottom surface 100b of the edge region B of the substrate 100.

Figure 6:
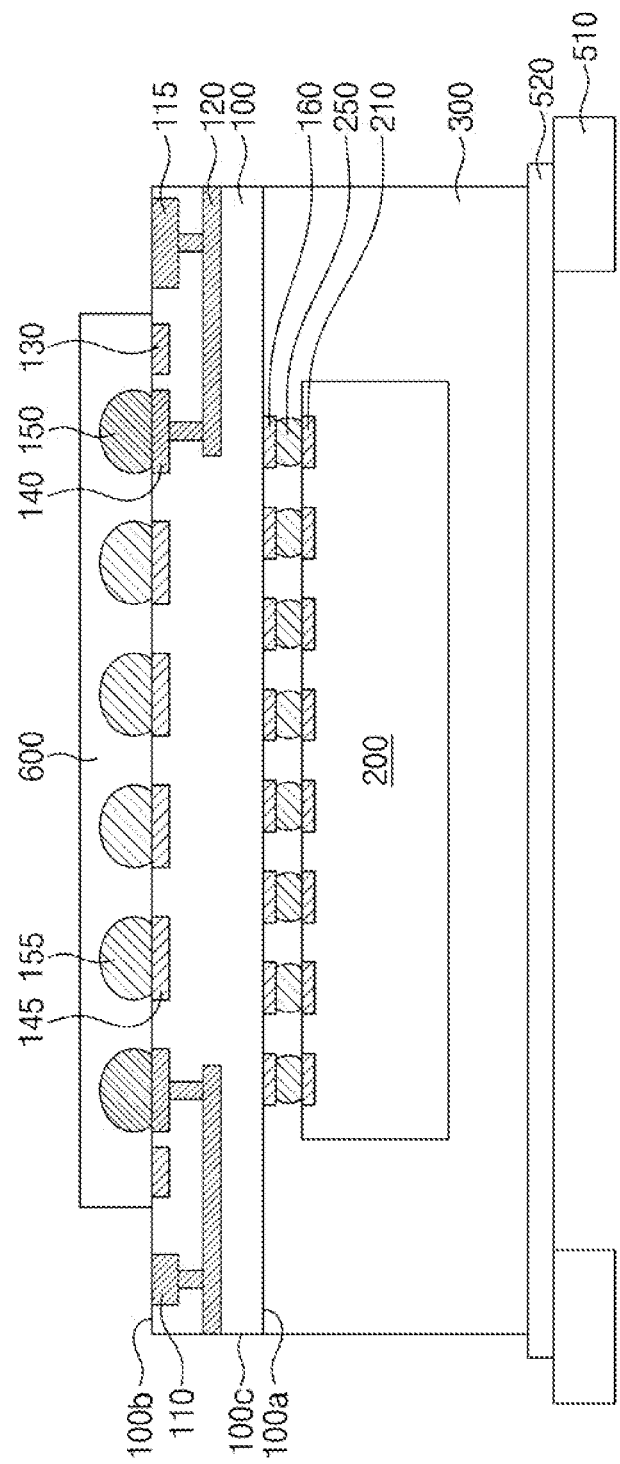

Referring to FIG. 6, the substrate 100 and the semiconductor chip 200 may be inverted. However, for consistency in description, top and bottom surfaces will be described based on the structure of FIG. 5. A supporting layer 510 may be provided on the top surface of the mold layer 300. An adhesive layer 520 may be between the mold layer 300 and the supporting layer 510 to fasten the mold layer 300 and the substrate 100 to the supporting layer 510. The adhesive layer 520 may be formed of or include a polymer material (e.g., polyimide (PI)).

A protection layer 600 may be formed on the bottom surface 100b of the substrate 100 to cover a portion of the bottom surface 100b of the substrate 100. The protection layer 600 may cover the ground terminals 150, the outer terminals 155, and a top surface of the test pad 130. The protection layer 600 may define regions, in which opening regions will be formed in a subsequent process. The protection layer 600 may be formed of or include a polymer material (e.g., epoxy polymers or polyimide (PI)). In an implementation, the protection layer 600 may include opening regions exposing the test pad 130.

Figure 7:
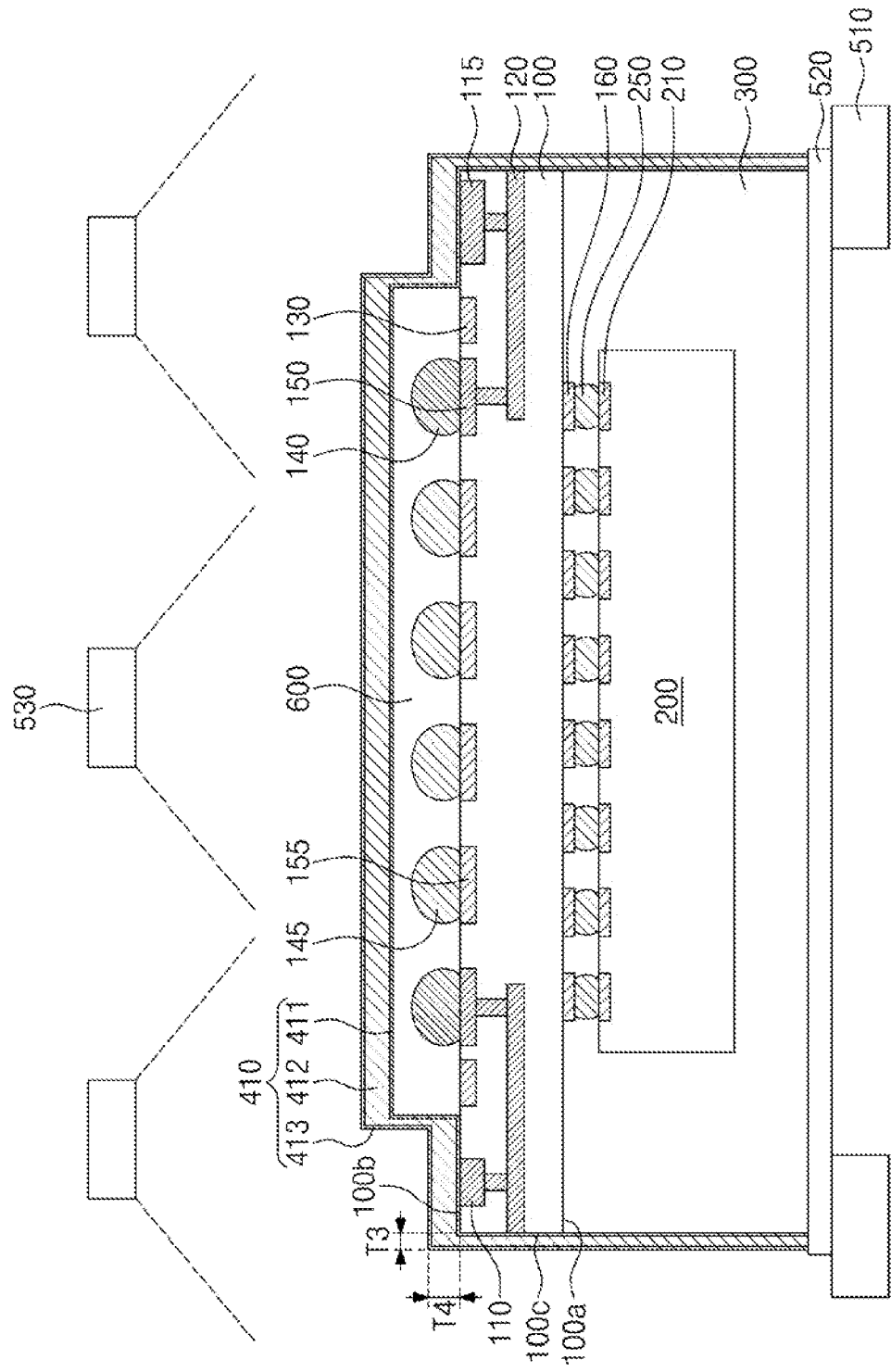

Referring to FIG. 7, a spray apparatus 530 may be provided on the bottom surface 100b of the substrate 100. A first shielding layer 410 may be formed on the bottom surface 100b of the substrate 100 using the spray apparatus 530. The first shielding layer 410 may be formed to cover the bottom surface 100b of the substrate, the protection layer 600, the side surface 100c of the substrate 100, and the side surface of the mold layer 300. The formation of the first shielding layer 410 may include sequentially forming a first lower seed layer 411, a first metal layer 412, and a first upper seed layer 413. The first lower seed layer 411, the first metal layer 412, and the first upper seed layer 413 may be formed by a spray coating process using the spray apparatus 530. In an implementation, they may be formed by a sputtering, chemical vapor deposition (CVD), or physical vapor deposition (PVD) process. The first metal layer 412 may include a conductive metal material and may be formed of or include a metal (e.g., copper (Cu) or silver (Ag)). In an implementation, the first lower seed layer 411 and the first upper seed layer 413 may be formed of or include stainless steel or steel use stainless (SUS). In the present specification, the structure including the first lower seed layer 411, the first metal layer 412, and the first upper seed layer 413 may be referred to as the first shielding layer 410.

When measured in the direction parallel to the top surface 100a of the substrate 100, a horizontal thickness T3 of the first shielding layer 410 (e.g., a distance between outer and inner side surfaces of the first shielding layer 410) may be in a range of 1.3 μm to 3.5 μm (e.g., from 2 μm to 3 μm). When measured in the direction perpendicular to the top surface 100a of the substrate 100, a vertical thickness T4 of the first shielding layer 410 (e.g., a distance between an outer top surface and an inner top surface of the first shielding layer 410, which are opposite to each other) may be in a range of 3 μm to 8 μm (e.g., from 4 μm to 6 μm).

Figure 8:
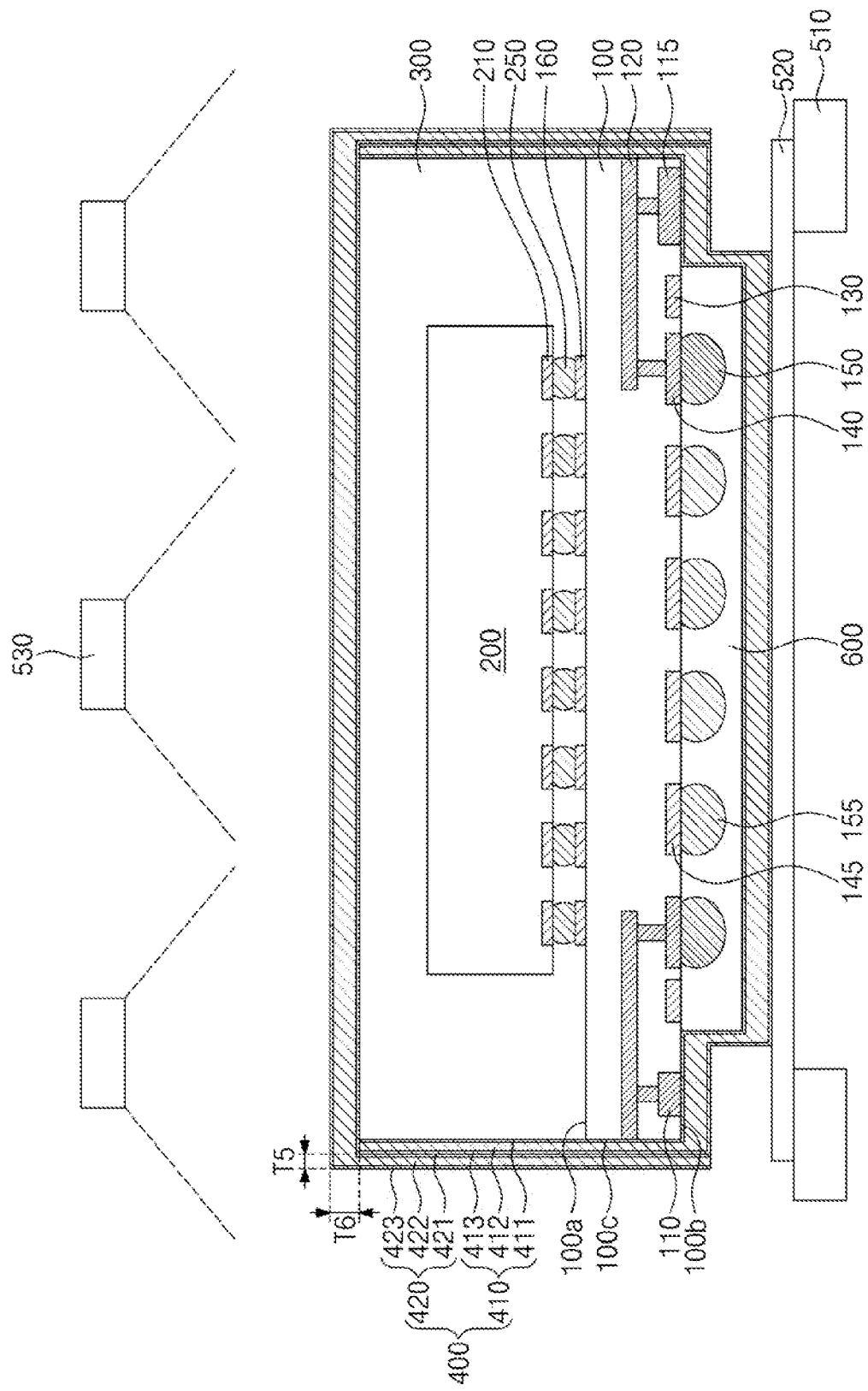

Referring to FIG. 8, the substrate 100 and the semiconductor chip 200 may be inverted. The spray apparatus 530 may be provided on the top surface 100a of the substrate 100. A second shielding layer 420 may be formed on the top surface 100a of the substrate 100 using the spray apparatus 530. The second shielding layer 420 may cover the top surface 100a of the substrate and the side surface of the first shielding layer 410. The formation of the second shielding layer 420 may include sequentially forming a second lower seed layer 421, a second metal layer 422, and a second upper seed layer 423. The second lower seed layer 421, the second metal layer 422, and the second upper seed layer 423 may be formed by a spray coating process using the spray apparatus 530. In an implementation, they may be formed by a sputtering, chemical vapor deposition (CVD), or physical vapor deposition (PVD) process. The second metal layer 422 may include a conductive metal material and may be formed of or include a metal (e.g., copper (Cu) or silver (Ag)). In an implementation, the second lower seed layer 421 and the second upper seed layer 423 may be formed of or include stainless steel or steel use stainless (SUS). In the present specification, the structure including the second lower seed layer 421, the second metal layer 422, and the second upper seed layer 423 may be referred to as the second shielding layer 420. In the present specification, the structure including the first shielding layer 410 and the second shielding layer 420 may be referred to as the shield layer 400.

When measured in the direction parallel to the top surface 100a of the substrate 100, a horizontal thickness T5 of the second shielding layer 420 (e.g., a distance between outer and inner side surfaces of the second shielding layer 420) may be in a range of 1.3 µm to 3.5 µm (e.g., from 2 µm to 3 µm). When measured in the direction perpendicular to the top surface 100a of the substrate 100, a vertical thickness T6 of the second shielding layer 420 (e.g., a distance between an outer top surface and an inner top surface of the second shielding layer 420, which are opposite to each other) may be in a range of 3 µm to 8 µm (e.g., from 4 µm to 6 µm).

In some devices, a thickness of a shield layer (e.g., a distance of an outer top surface and an inner top surface of the shield layer, which are opposite to each other) may be larger than a distance between outer and inner side surfaces of the shield layer. For example, a horizontal thickness of the shield layer may be different from a vertical thickness of the shield layer, and in this case, it may be difficult to effectively shield an electromagnetic wave emitted through a side surface of the semiconductor package. In an implementation, the first shielding layer 410 may be formed on the side surface 100c of the substrate 100, and then, the second shielding layer 420 may be formed on the side surface 100c of the substrate 100 such that the horizontal thickness T1 of the shield layer 400 (e.g., a distance between the outer and inner side surfaces) may be 80% to 90% of the vertical thickness T2 of the shield layer 400 (e.g., a distance between an outer top surface and an inner top surface opposite to each other). Accordingly, it is possible to reduce a difference between the horizontal and vertical thicknesses T1 and T2 of the shield layer 400 and thereby to more effectively shield an electromagnetic wave emitted through the side surface of the semiconductor package.

Figure 9:
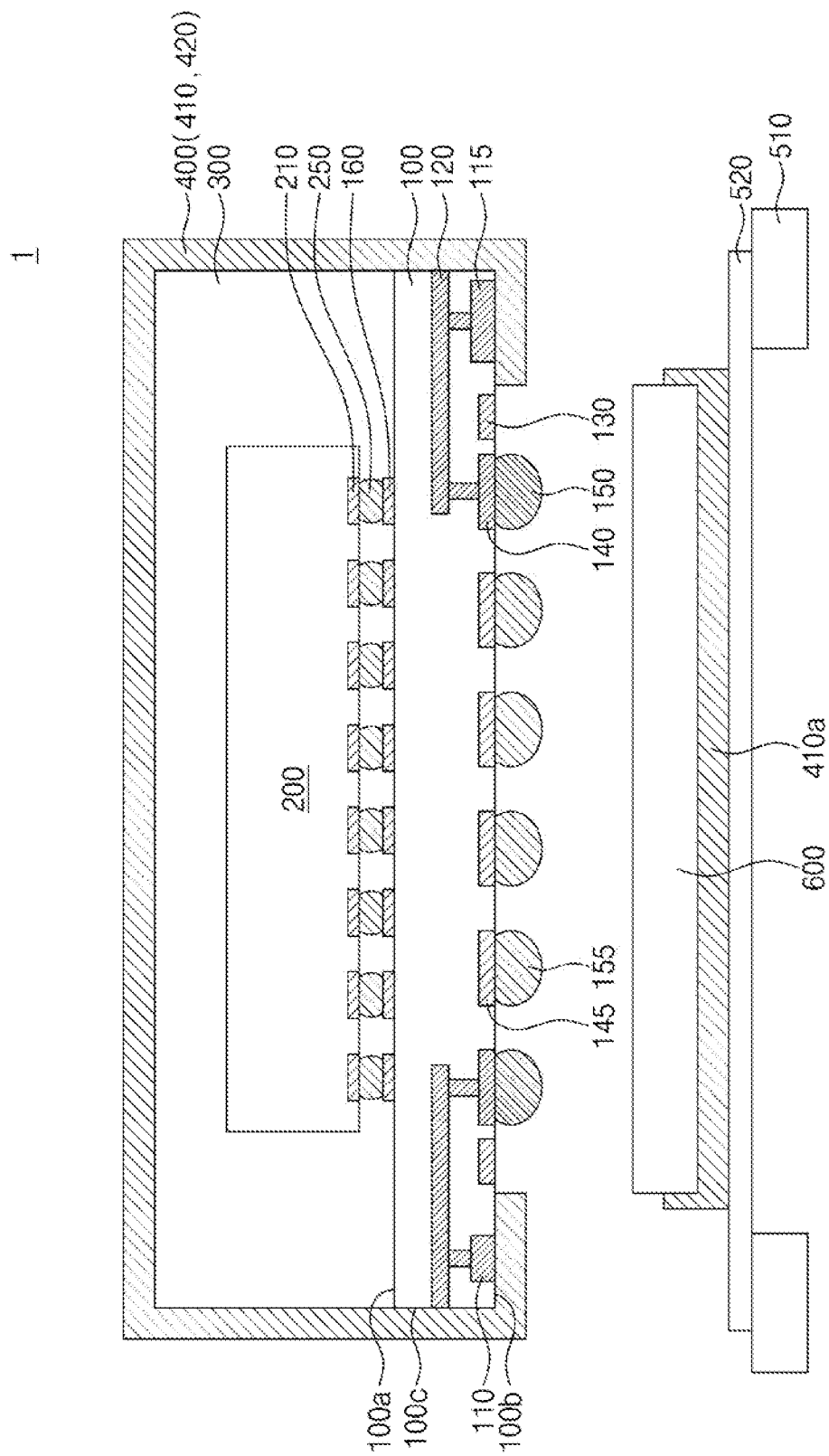

Referring to FIG. 9, the protection layer 600 may be removed. The removal of the protection layer 600 may include removing the supporting layer 510, the adhesive layer 520, and the protection layer 600 from the bottom surface 100b of the substrate 100. The removal of the protection layer 600 may include removing a portion 410a of the first shielding layer 410, which is between the adhesive layer 520 and the protection layer 600. As a result of the removal of the protection layer 600, the first opening region 400T1 may be formed on the bottom surface of the shield layer 400. Accordingly, the semiconductor package 1, in which the shield layer 400 including the first opening region 400T1 is formed, may be formed. The semiconductor package 1 may be configured to have substantially the same features as those described with reference to FIGS. 1 and 2.

In the method of fabricating a semiconductor package according to an embodiment, the protection layer 600 may be formed to cover the test pad 130, the outer terminal 155, the ground terminal 150, and a portion of the bottom surface 100b of the substrate 100. Thus, the test pad 130 and the terminal pad 145 may be exposed, and the shield layer 400 may be prevented from being electrically connected to the test pad 130 and the terminal pad 145 through a short circuit. In addition, the test pad 130, the outer terminal 155, and the ground terminal 150 may be protected by the protection layer 600, during the formation of the shield layer 400.

According to an embodiment, a semiconductor package may include a shield layer, which extends onto a bottom surface of a substrate, and thus, it is possible to help prevent an electromagnetic wave from being emitted to the outside through the bottom surface of the substrate and thereby to help improve the ability of shielding an electromagnetic wave. In addition, the shield layer may have an opening region exposing a test pad and a terminal pad, and thus, it is possible to help prevent a short circuit from occurring between the test pad and the terminal pad. Furthermore, a terminal on a chip region of the substrate may be used as a ground terminal, and thus, it may be unnecessary to additionally form ground terminals on an edge region of the substrate. Accordingly, it may be possible to simplify the overall fabrication process of the semiconductor package.

By way of summation and review, with the recent development of the electronics industry, a semiconductor package technology is developing in various ways with a view toward miniaturization, weight reduction, and manufacturing cost reduction. In addition, as the use of this technology is expanded to various fields such as mass storage devices, various types of semiconductor packages have been considered. A semiconductor chip may emit an electromagnetic wave serving as a noise in another semiconductor chip. This noise caused by the electromagnetic wave could lead to malfunction of the semiconductor chip. In addition, an electromagnetic interference issue could occur between a semiconductor package and a neighboring electronic device.

One or more embodiments may provide a semiconductor package, in which a shield layer blocking an electromagnetic wave is provided.

One or more embodiments may provide a semiconductor package, which may help prevent an external device from being interfered by an electromagnetic wave generated in the package.

One or more embodiments may provide a method of fabricating a semiconductor package, which may help prevent an external device from being interfered by an electromagnetic wave generated in the package.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor package, comprising:
a substrate including at least one ground pad and a ground terminal pad;
a semiconductor chip on the substrate;

a shield layer on the substrate and covering the semiconductor chip;
a ground terminal on a bottom surface of the ground terminal pad,
wherein:
the shield layer extends onto a bottom surface of the substrate and includes an opening region on the bottom surface of the substrate,
a bottom surface of the at least one ground pad is at the bottom surface of the substrate,
the shield layer on the bottom surface of the substrate is in contact with the bottom surface of the at least one ground pad, and
a distance between a sidewall of the at least one ground pad and the shield layer is shorter than a distance between a sidewall of the ground terminal pad and the shield layer; and
a test pad on the bottom surface of the substrate, wherein the test pad is aligned with the opening region of the shield layer such that the opening region of the shield layer exposes the test pad.

2. The semiconductor package as claimed in claim 1, further comprising a ground pattern in the substrate,
wherein:
the ground terminal is in the opening region of the shield layer, and
the ground terminal is electrically connected to the shield layer through the at least one ground pad or the ground pattern.

3. The semiconductor package as claimed in claim 2, wherein:
the substrate includes:
a chip region, on which the semiconductor chip is mounted, and
an edge region, on which the semiconductor chip is not mounted, and the ground terminal is on the chip region.

4. The semiconductor package as claimed in claim 1, wherein:
the at least one ground pad includes at least one first ground pad and a second ground pad,
an area of the second ground pad is larger than an area of the at least one first ground pad, when viewed in a plan view, and
a width of the at least one first ground pad in a direction parallel to a top surface of the substrate is in a range of 280 μm to 600 μm.

5. The semiconductor package as claimed in claim 4, wherein:
the at least one first ground pad includes a plurality of first ground pads, and
a horizontal distance between the first ground pads of the plurality of first ground pads is in a range of 100 μm to 1.03 mm.

6. The semiconductor package as claimed in claim 1, further comprising a mold layer on the substrate and covering the semiconductor chip,
wherein the mold layer is between the semiconductor chip and the shield layer.

7. The semiconductor package as claimed in claim 1, wherein a distance between an outer side surface and an inner side surface of the shield layer in a direction parallel to a top surface of the substrate is in a range of 2.6 μm to 7.0 μm.

8. The semiconductor package as claimed in claim 1, wherein a distance between an outer top surface and an inner top surface of the shield layer opposite to each other in a direction perpendicular to a top surface of the substrate is in a range of 3 μm to 8 μm.

9. A semiconductor package, comprising:
a substrate including a chip region;
a semiconductor chip on the chip region of the substrate;
a mold layer on the substrate and covering the semiconductor chip;
a shield layer on the mold layer and covering a top surface and a side surface of the mold layer and a side surface of the substrate, the shield layer extending onto a bottom surface of the substrate and including an opening region on the bottom surface of the substrate; and
a ground terminal on the bottom surface of the substrate and electrically connected to the shield layer,
wherein the ground terminal is on the chip region, and
wherein the substrate includes a first ground pad and a second ground pad at the bottom surface of the substrate, and an area of the second ground pad is larger than an area of the first ground pad, when viewed in a plan view.

10. The semiconductor package as claimed in claim 9, further comprising a ground pattern in the substrate,
wherein:
bottom surfaces of the first ground pad and the second ground pad are at the bottom surface of the substrate,
a side surface of the ground pattern is at the side surface of the substrate, and
the shield layer on the bottom surface of the substrate is in contact with the bottom surfaces of the first ground pad and the second ground pad and the side surface of the ground pattern.

11. The semiconductor package as claimed in claim 9, further comprising an outer terminal on the bottom surface of the substrate,
wherein the ground terminal and the outer terminal are aligned with the opening region of the shield layer such that the opening region of the shield layer exposes the ground terminal and the outer terminal.

12. The semiconductor package as claimed in claim 9, further comprising a test pad on the bottom surface of the substrate,
wherein the test pad is aligned with the opening region of the shield layer such that the opening region exposes the test pad.

13. A semiconductor package, comprising:
a substrate including at least one ground pad, a ground pattern, and a chip region;
a semiconductor chip on the substrate;
a mold layer on the substrate and covering the semiconductor chip;
a shield layer on the mold layer and covering a top surface and a side surface of the mold layer and a side surface of the substrate, the shield layer extending onto a bottom surface of the substrate;
a test pad at the bottom surface of the substrate; and
a ground terminal on the bottom surface of the substrate,
wherein:
the ground terminal is disposed on the chip region, and the test pad is between the at least one ground pad and the ground terminal, and vertically overlaps the ground pattern.

14. The semiconductor package as claimed in claim 13, further comprising an outer terminal on the bottom surface of the substrate,
wherein:

the shield layer further includes a plurality of opening regions on the bottom surface of the substrate, the test pad and the ground terminal are aligned with the plurality of opening regions of the shield layer such that the plurality of opening regions of the shield layer expose the test pad and the ground terminal, the plurality of opening regions of the shield layer include a first opening region, a second opening region, and a third opening region, the ground terminal and the outer terminal are aligned with the first opening region such that the first opening region exposes the ground terminal and the outer terminal, and the second opening region and the third opening region are spaced apart from each other with the first opening region therebetween, the test pad being aligned with the second opening region and the third opening region such that the second opening region and the third opening region expose the test pad.

15. The semiconductor package as claimed in claim 14, wherein:
the substrate further includes a ground terminal pad,
the at least one ground pad includes a first ground pad and a second ground pad,
an area of the second ground pad is larger than an area of the first ground pad, when viewed in a plan view,
the second opening region is between the first ground pad and the ground terminal pad, and
the third opening region is between the second ground pad and the ground terminal pad.

16. The semiconductor package as claimed in claim 14, wherein a horizontal distance between a side surface of the test pad and an inner side surface of the second opening region is in a range of 50 μm to 100 μm.

17. The semiconductor package as claimed in claim 14, wherein:
the substrate further includes a ground terminal pad, and
a horizontal distance between a side surface of the ground terminal pad and an inner side surface of the first opening region is in a range of 50 μm to 100 μm.

18. The semiconductor package as claimed in claim 13, wherein:
the substrate further includes an edge region, on which the semiconductor chip is not mounted,
the semiconductor chip is mounted on the chip region, and
the ground terminal is on the chip region.

* * * * *